(12) United States Patent
Sleeman et al.

(10) Patent No.: US 7,468,602 B2
(45) Date of Patent: Dec. 23, 2008

(54) DIGITAL MULTI-METER

(75) Inventors: Peter T. Sleeman, Hampshire (GB);
Kevin M. Easter, Hampshire (GB)

(73) Assignee: Elan Digital Systems Limited, Hampshire (GB)

( * ) Notice: Subject to any disclaimer, the term of this patent is extended or adjusted under 35 U.S.C. 154(b) by 0 days.

(21) Appl. No.: 10/569,911

(22) PCT Filed: Aug. 13, 2004

(86) PCT No.: PCT/GB2004/003487

§ 371 (c)(1),
(2), (4) Date: Oct. 26, 2006

(87) PCT Pub. No.: WO2005/022172

PCT Pub. Date: Mar. 10, 2005

(65) Prior Publication Data

US 2007/0069716 A1    Mar. 29, 2007

(30) Foreign Application Priority Data

Sep. 1, 2003   (GB) ................................. 0320455.9

(51) Int. Cl.
*G01R 17/06* (2006.01)
(52) U.S. Cl. ..................................... 324/99 D; 324/115
(58) Field of Classification Search .............. 324/158.1, 324/73.1, 115–116, 99 D, 103 R, 142; 702/57–60; 713/320; 248/456; 345/169; 361/728
See application file for complete search history.

(56) References Cited

U.S. PATENT DOCUMENTS

| | | | |
|---|---|---|---|
| 5,848,373 A * | 12/1998 | DeLorme et al. ............ 701/200 |
| 5,927,673 A * | 7/1999 | Kurokawa et al. .......... 248/456 |
| 6,098,095 A | 8/2000 | Nelson et al. | |
| 6,914,594 B2 * | 7/2005 | Chuang ...................... 345/169 |
| 6,931,554 B2 * | 8/2005 | Kung .......................... 713/320 |
| 6,985,819 B2 * | 1/2006 | Lipscomb et al. ............. 702/57 |
| 7,050,306 B1 * | 5/2006 | Ribeiro et al. .............. 361/728 |
| 2002/0149569 A1 * | 10/2002 | Dutta et al. ................. 345/173 |
| 2003/0034769 A1 | 2/2003 | Lipscpmb et al. | |

FOREIGN PATENT DOCUMENTS

WO    03/016925    2/2003

* cited by examiner

*Primary Examiner*—Vinh P Nguyen
(74) *Attorney, Agent, or Firm*—Renner, Otto, Boisselle & Sklar, LLP

(57) ABSTRACT

A digital multi-meter (DMM) is described which can be inserted into a peripheral device card expansion slot of a personal digital assistant (PDA) to provide the PDA with DMM functionality. The DMM is configurable by configuration data supplied by application software running on the PDA. Configuration of the DMM may include, for example, setting measurement function and input ranges. The DMM internal circuitry measures input signals, digitizes them and supplies them to the PDA for display and/or storage. This allows for a data acquisition unit which combines a DMM with the computing power of a PDA. The PDA may be programmed to display or store data in a multitude of ways, depending on the requirements of a particular application. The combined DMM and PDA may benefit from various other functions of the PDA, for example wireless communication of data to allow remote data logging.

34 Claims, 5 Drawing Sheets

DIGITAL MULTI-METER

This application is a national phase of international Application No. PCT/GB2004/003487 filed Aug. 13, 2004 and published in the English Language.

BACKGROUND OF THE INVENTION

The invention relates to digital multi-meter (DMMs) peripheral device cards.

FIG. 1 is a schematic diagram showing a conventional DMM. The DMM has a main body 2 which includes a rotary function selection switch 4, a negative input terminal 5, a positive input terminal 6 and a display screen 8. The function selection switch 4 is for switching the DMM on and selecting between different measurement functions, such as direct-current (DC) voltage, alternating-current (AC) voltage, resistance, DC current and AC current. The input terminals 4 allow the DMM to be connected via industry standard 4 mm banana connections to a pair of test probes 10. In operation the test probes are connected to a circuit or component under test. The display screen 8 is for displaying measurement information to a user, for example type of measurement being made and a numerical representation of the measurement value. In the example shown in FIG. 1, the display screen indicates that a DC voltage value of 0.3456 volts is present between the pair of test probes. The screen display for the DMM shown in FIG. 1 also includes a bar-graph type element for representing the measurement value as a percentage of a pre-determined range. This type of representation typically shows a measurement value with lower resolution than a numerical representation, but which can be updated faster.

FIG. 2 is a schematic diagram showing the internal circuitry of the conventional DMM shown in FIG. 1. The circuitry is powered by a battery of cells 14 which provide a voltage of $V_{batt}$ volts. The negative input terminal 5 is connected to the low voltage side of the battery of cells 14 and define a zero reference voltage $V_0$. The high voltage side of the battery of cells is used to drive a reference voltage generating circuit 18 for generating positive and negative reference voltages V+ and V− respectively. The provision of both positive and negative reference voltages allows the DMM to measure positive and negative input voltages at the positive input terminal 6 with respect to the negative input terminal.

The position of the function selection switch 4 determines whether the positive input terminal is connected one of a DC voltage measuring circuit 20, a DC current measurement circuit 22 or a resistance measuring circuit 24. For simplicity, corresponding AC measuring circuitry is not shown in FIG. 2. The operation of each of the respective measuring circuits 22, 24, 26 is well known and not described here further. Each of the measurement circuits outputs an analogue voltage which is indicative of the measurement value of the measurement being made. The analogue voltage from the relevant measurement circuit is connected to an analogue-to-digital converter (ADC) 16, as determined by the position of the function selection switch 4. The ADC converts the analogue voltage to a digital signal, a representation of which can then be displayed on the display 8. Except for the input terminals, the internal circuitry of the DMM is fully insulated from the DMM housing by an insulation barrier 12. This is to prevent possibly hazardous internal voltages being accidentally applied to a user.

DMMs of the kind shown in FIGS. 1 and 2 have been around for several years with many commercial examples now available. Typically these come in a range of physical sizes ranging from comfortably pocket sized models to those which are better suited to workbench or desk use. A number of variations of the classic DMM are available, for example models with more or fewer measurement functions than shown in FIG. 1 or models with different measurement range and resolution. Some DMMs include the ability to store a number of measurements in an internal memory. The measurements can then be downloaded to a computer, normally via an RS232/RS422 or HPIB connection. These DMMs can typically take measurements at a few tens of samples per second. DMMs of this kind are useful and popular tools due to their portability and ease of use, however, their usefulness is hampered by the limited functional flexibility they provide, especially as regards how measurements can be viewed and stored.

With the rise in popularity of mobile computing, DMMs have become available in Personal Computer Memory Card International Association (PCMCIA) form-factor. These PCMCIA DMMs plug into industry standard PCMCIA slots in laptop computers. PCMCIA DMMs operate according to the same general principles as those described above for classic DMMs. However, PCMCIA DMMs have the advantage that they can use the display of the computer to present their readings in place of a dedicated screen display. This gives more freedom to a designer in how best to present measurement data to a user. However, this freedom comes at a cost in reduced portability over that of conventional DMMs. One example of a commercially available PCMCIA DMM card is the National Instruments NI PCMCIA-4050 PCMCIA card. This is a single channel DMM able to measure DC and AC voltages and resistance. It is able to measure DC and AC current with an appropriate external adapter. The card is a Type II format PCMCIA card and is 5 mm thick and measures approximately 85 mm×44 mm. The card has a hardwired flying-lead cable that terminates in two 4 mm banana sockets for connection to industry standard test leads.

SUMMARY OF THE INVENTION

According to a first aspect of the invention there is provided a digital multi-meter (DMM including a personal digital assistant (PDA) peripheral device card conformant interface, the DMM being operable to output measurement data to the PDA conformant interface in response to input signals applied to input terminals and the operation of the DMM being configurable by configuration data received from the PDA conformant interface.

A DMM of this kind can be connected to host PDA to take advantage of the computing power of the host computing device, thus making a versatile test instrument. Because PDAs are generally hand-held devices, this provides a fully flexible yet nonetheless portable test instrument. Circuitry within the DMM can be optimised for the task of taking and outputting measurement data, while the PDA can be configured for the task of processing and displaying measurement data. Since the DMM does not have to perform subsidiary processing or display functions, the circuitry required to perform the DMM function can be fitted within the tight constraints of typical PDA conformant form factors, such as the compact flash (CF), "newcard" and Secure Digital Input/Output (SDIO) form factors. The DMM can also be connected easily and quickly into a host PDA to form a data acquisition unit which looks and functions like a conventional handheld DMM. This makes the DMM immediately accessible to users who are already familiar with conventional DMMs.

The DMM may include a mating part and an extension housing with the mating part conforming to a form factor of the PDA conformant interface and the extension housing providing additional space for circuitry and external connections, the mating part and the extension housing being attached together to form a single structure. This arrangement of mating part and extension housing provides a DMM which can easily be inserted into and withdrawn from a host computing device, since a user can comfortably grip the extension housing, and also provides additional room for circuitry which cannot easily be fitted within the form factor of the PDA conformant interface. The extension housing also provides mounting space for industry standard connection sockets, for example 4 mm banana sockets, which would not otherwise fit within typical PDA conformant form factors. These sockets are beneficial since they allow standard test probes to be used with the DMM which removes the need to rely on fixed probes attached to flying-leads. This reduces problems associated with using flying-leads, such as the ease with which they can become damaged and the fact that they do not easily allow different types of test probes to be used.

To provide additional strength, the DMM may further include a load-bearing component which extends through both the mating part and the extension housing, the mating part and the extension housing being connected to the load-bearing component. The use of a load-bearing component extending through the mating part and extension housing allows insertion and withdrawal forces to be transmitted linearly along a central axis of the DMM without the undue application of twisting forces to the DMM. This makes for a more rugged construction than would otherwise be possible.

The load-bearing component may be a printed circuit board (PCB) containing circuitry of the DMM. By having a PCB as the load-bearing component, the benefits of the load-bearing component can be achieved without having to include purely structural elements, thus reducing cost and complexity. If desired, the PCB can be made thicker than is normally used in PDA conformant peripheral device cards, for example 1.2 mm or more, rather than the usual 0.6 mm, to provide increased structural strength.

To take farther advantage of the additional rigidity provided by the load-bearing component along the DMM central axis, the DMM input terminals may comprise connection sockets mounted on an end face of the extension housing distal to the mating part. By placing input sockets on the end face, forces associated with the insertion and removal of test probe connections are mostly transmitted along the same central axis as those associated with the insertion and removal of the DMM from a host device.

The DMM may further include an electrically isolated data coupler arranged to couple data lines, for example measurement-data lines for carrying measurement data or configuration-data lines for carrying configuration data, between a front-end and a rear-end of the DMM. Use of such a data coupler allows data to be transferred within the DMM without requiring continuous electrical connection. This makes it possible to electrically isolate the two ends of the DMM from each other. Since in use one end of a DMM may be connected to high voltages, this electrical isolation provides a degree of protection for a host computing device to which the DMM is connected (and a user of the DMM ) against voltages that which easily damage the host device (or injure the user). The data coupler may comprise, for example, opto-couplers, DC-DC converters, inductive couplers or magneto-couplers.

Since data couplers can be relatively bulky items, at least one of the configuration-data lines and at least one of the measurement-data lines may be connected together, and coupled through a common channel of the electrically isolated data coupler. This reduces the number of electrically isolated data channels which are required. In examples where configuration data are transferred according to a first protocol and measurement data are transferred according to a second different protocol, the DMM may further include means for indicating whether data transferred along the common channel are transferred according to the first or the second protocol. This allows elements of the internal circuitry to correctly interact on the common channel without protocol clashing. The means for indicating may comprise flag lines or specific addressing procedures which can be used to indicate whether configuration data or measurement data are being transferred at any given time.

The DMM may also include an electrically isolated power coupler arranged to couple operating power between the front-end and the rear-end of the DMM, so providing further electrical isolation between the front- and rear-ends of the DMM.

The DMM may be operable to receive operating power through the PDA conformant interface. This reduces the number of internal components required for the DMM and removes the need for a user to provide independent power sources for the DMM and a host PDA to which it is connected in use.

The DMM may include measurement circuitry which is configured to operate from a uni-polar power supply, the DMM further including a voltage divider connected between lower and upper voltages of the uni-polar power supply to provide a reference voltage, the reference voltage being connected to a one of the input terminals. The use of a uni-polar power supply reduces the component count of the DMM and allows many off-the-shelf components which require a uni-polar power supply to be used The voltage divider arrangement allows input signals which swing both positive and negative relative to the reference voltage level to be measured notwithstanding the use of a uni-polar power supply.

The DMM may also include a stowable stand which can be arranged to support the DMM when in use. This allows a user to position the DMM for easy viewing when his hands are not available to hold it.

The DMM may include multiple independent measurement channels. This allow a user to compare multiple input signals quickly and easily and without having to re-connect the test leads between taking measurements of input signals. A dual channel system can be particularly useful when performing adjustment or diagnostic testing of a system.

According to a second aspect of the invention there is provided a computing device including a personal digital assistant (PDA) peripheral device card conformant interface, the computing device having a program memory storing a software application for configuring the computing device to supply digital multi-meter (DMM) configuration data to the PDA conformant interface and to receive DMM measurement data through the PDA conformant interface.

This kind of computing device is readily connectable to the DMM of the first aspect of the invention.

The computing device may include a display screen and the software application operable to configure the computing device to display measurement data received through the PDA conformant interface on the display screen. This allows a user to view measurement data outputted by a DMM in a manner determined by the application software. This provides for a great deal of flexibility in how measurement data are displayed to a user.

The computing device may include a data memory and the software application operable configure the computing device to store measurement data received through the PDA conformant interface in the data memory. This allows a DMM of the first aspect of the invention to rely on the memory of the computing device to store data, thus reducing the need for memory in the DMM, while still allowing historical data measurements to be maintained.

The software application may be operable to configure the computing device to supply configuration data to the PDA conformant interface in response to measurement data received through the PDA conformant interface. For example, if the measurement data indicate that an input signal exceeds an input range of a connected DMM, the host device may reconfigure the DMM to modify its input range, such as by changing the attenuation of an input signal using a switchable attenuator. In another example, the host device may be programmed to only allow configuration data to be supplied to the DMM to configure it into a current measuring mode if a voltage level between the input terminals is first ascertained to determine whether it is safe to enable current measuring mode with the connected input signal.

The widespread use and support of PDA conformant platforms ensures that there is a wide range of functionality which the host computing devices can provide to further enhance its use in conjunction with a DMM of the first aspect of the invention.

For example, the computing device may include a wireless communication system. The computing device may then be configured to communicate measurement data received through the PDA conformant interface to a remote receiver using the wireless communication system, or to receive DMM configuration data from a remote transmitter and to supply the configuration data to the PDA conformant interface.

This allows the computing device to be used in conjunction with the DMM of the first aspect of the invention in circumstances in which it would not be possible to use a conventional DMM. For example, measurement data can be transferred between a closely separated data acquisition unit and receiver without requiring a physical connection. This can allow data to be collected and viewed in real time from a data acquisition unit which is placed in an inaccessible location, for example inside a vacuum chamber or other enclosed space, or to allow communication between rooms in a building without needing to run cabling. The connection may be via a dedicated one-to-one communication link, for example a BLUETOOTH (RTM) connection, or the data acquisition unit may interface with a wireless local area network and so appear as simply another network device, for example using the 802.11 standard. Wireless communication also allows a data acquisition unit to be placed in a hostile environment, for example within hazardous areas of a nuclear power station, and measurement data relayed to a remote location for viewing and analysis. If a data acquisition unit and a remote receiver are large distances apart, communication may occur via a cellular phone network for host devices with mobile phone capabilities. In addition to transmitting measurement data, the computing device can receive DMM configuration data, thus providing a fully functional yet remote operated version of the DMM and computing device.

Further capabilities of the computing device can also be used, for example the computing device may also include a speech synthesis system with the software application operable to configure the computing device to announce measurement data received through the PDA conformant interface. This would allow a user to be informed of data readings where he does not have a direct line-of-sight to the computing device or where he is required to concentrate on correctly positioning test probes. This can be useful where a user is measuring signals in a system where it may be dangerous for a test probe to slip and, for example, cause an electrical short in the system under test or connect the probe to a high voltage conductor.

According to a third aspect of the invention there is provided a computer program product comprising machine readable instructions for configuring the computing device of the second aspect of the invention. The computer program product may comprise a computer program on a carrier medium. The carrier medium may be a storage medium, such as a magnetic, optical, magneto-optical or other storage medium. The carrier medium could be a transmission medium such as broadcast, telephonic, computer network, wired, wireless, electrical, electromagnetic, optical or indeed any other transmission medium.

According to a fourth aspect of the invention, there is provided a data acquisition unit comprising a DMM according to the first aspect of the invention and a computing device according to the second aspect of the invention, the DMM and the computing device being connectable through their respective PDA conformant interfaces.

BRIEF DESCRIPTION OF THE DRAWINGS

For a better understanding of the invention and to show how the same may be carried into effect reference is now made by way of example to the accompanying drawings in which.

DETAILED DESCRIPTION

A DMM is described which can be connected to a Personal Digital Assistant (PDA) or similar device via a standard Compact Flash card (CF) interface.

Figure 3:
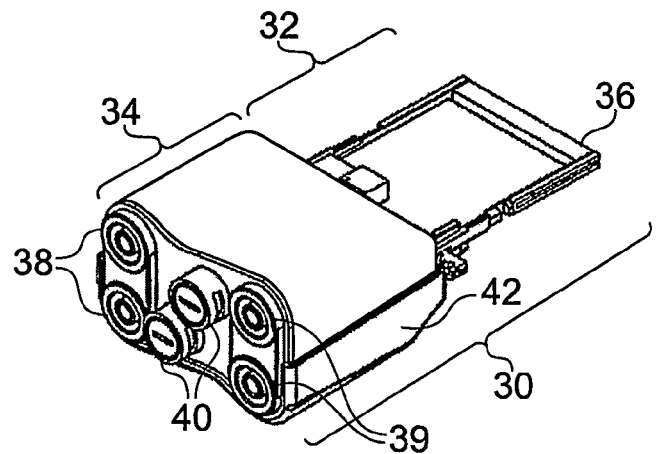
FIG. 3 is a schematic perspective view of a compact flash (CF) DMM according to an embodiment of the invention.

FIG. 3 shows the physical structure of a CF DMM 30 according to a first embodiment of the invention. The CF DMM in this example is dual channel device having first and second independent measurement channels. These dual channels allow simultaneous measurement of two signals which is a common requirement when performing adjustment or diagnostic testing. In other examples only one, or more than two measurement channels may be used. The CF DMM 30 comprises two main parts, a mating part 32 and an extension housing 34. The mating part conforms to the CF interface, it has a physical size conforming to the CF form factor and includes a CF format electrical connector 36. This allows the CF DMM 30 to be readily connected to a host device having a CF expansion socket, for example a Personal Digital Assistant (PDA). The extension housing 34 provides space for internal circuitry of the CF DMM and external connections which are not be fitted within the mating part. The mating part and the extension housing are attached together to form a single body. The mating part and the extension housing co-extend in a plane substantially parallel to the upper and lower faces of the mating part such that insertion and withdrawal forces are transmitted along a long axis of the CF DMM which lies in this plane. This reduces bending forces applied to the CF DMM during insertion or withdrawal of the CF DMM into a host device so making it an easy process and one which is unlikely to damage the CF DMM or the host device.

Two pairs of 4 mm banana sockets 38, 39 and a pair of fuse holders 40 are mounted on an outer end face of the extension housing. The banana sockets 38, 39 are disposed symmetrically about, and close to, the long axis of the CF DMM such that insertion forces arising from the attachment of test leads are transmitted predominantly along the length of the CF DMM. This reduces twisting distortions and provides increased resistance to rugged handling. A first pair of banana sockets 38 are input terminals for the first channel of the dual channel CF DMM and a second pair of banana sockets 39 are input terminals for the second channel. Fuses to protect each of the CF DMM measurement channels against excessive input current are mounted in respective ones of the fuse holders 40.

Except for the input terminals 38, 39 the outer surface of the extension housing comprises a plastic case 42 which provides electrical insulation between the CF DMM's internal circuitry and a user.

Figure 4:
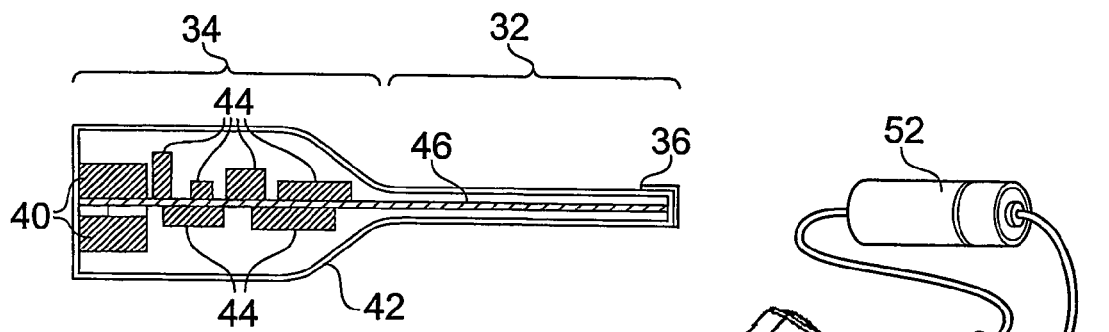
FIG. 4 is a schematic section view of the CF DMM of FIG. 3.

FIG. 4 shows in vertical section a view through the centre of the CF DMM shown in FIG. 3. The mating part 32, the extension housing 34, the plastic case 42 and the fuse holders 40 can be seen. In addition, internal circuitry elements 44 are shown along with a printed circuit board (PCB) 46 on which the circuitry elements 44 are mounted. The internal circuitry elements provide the functionality of the CF DMM and are discussed further below. The PCB 46 is a single planar PCB running the full length of the CF DMM. Most CF conformant peripheral device cards use thin PCBs (approximately 0.6 to 0.7 mm thick), however, the PCB 46 employed in the CF DMM is 1.2 mm thick. This provides additional strength for the whole assembly with the PCB 46 becoming an integral part of the mechanical rigidity of the CF DMM. The plastic case is rigidly attached to the PCB, for example by screw fixing means or by way of clips moulded into the housing, to further add to the mechanical rigidity of the CF DMM.

Figure 5:
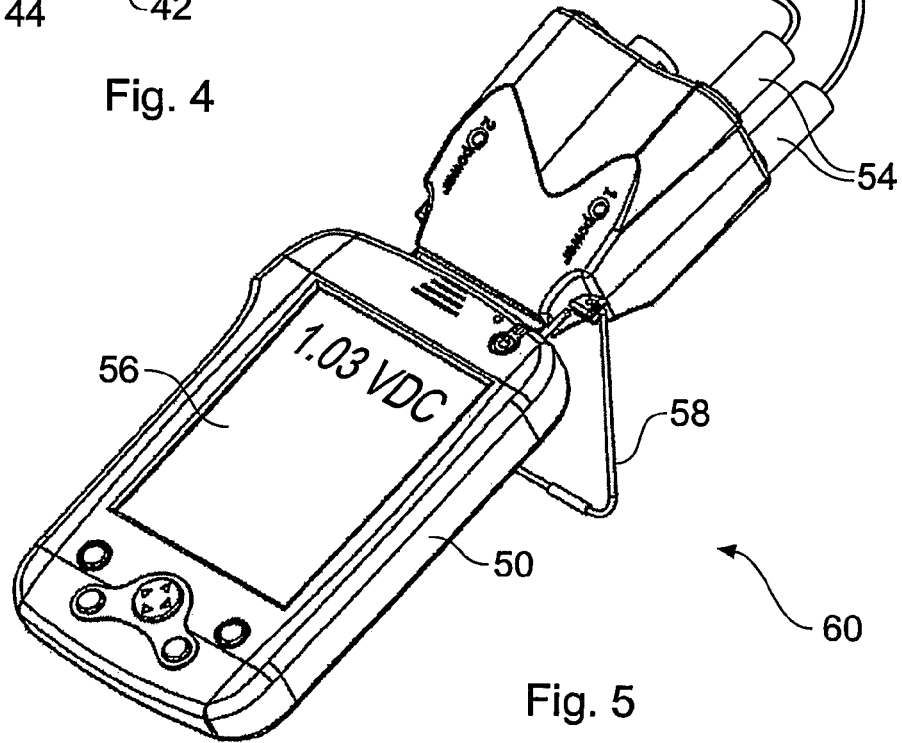
FIG. 5 is a schematic perspective view of the CF DMM of FIG. 3 connected to a Personal Digital Assistant (PDA) host device and being used to measure the voltage of a cell.

FIG. 5 is a schematic perspective view showing the CF DMM 30 of FIGS. 3 and 4 inserted into a CF expansion socket of a PDA 50. The PDA runs a software application which allows it to interact with and control the CF DMM. The software application is responsible for generating configuration data for configuring the CF DMM, for example, in response to user input, and also for receiving measurement data from the CF DMM. There is a large degree of flexibility in designing how the software application running on the PDA operates, for example how it displays data to a user or which additional functions it can perform, examples of which are given below.

The CF DMM and PDA together comprise a data acquisition unit 60. The data acquisition unit 60 is shown being used to measure and display the voltage of a cell 52. Output terminals of the cell are connected to respective ones of the first pair of input terminals 38 of the CF DMM using a pair of conventional test probes 54. The second pair of input terminals 39, and the corresponding second channel of the CF DMM, are unused in this example. The PDA supplies power and configuration data to the CF DMM. The configuration data is used to configure the CF DMM to measure DC voltages. The CF DMM measures the voltage at the input terminals and supplies measurement data to the PDA via the CF interface. This process is described further below. The PDA is programmed to receive the measurement data from the CF DMM and display it on the PDA screen 56. In this example, the cell DC voltage is measured to be 1.03 volts.

The CF DMM incorporates a fold-down stand 58 attached to the extension housing. The stand allows the combined data acquisition unit 60 to sit at an angle to a supporting surface and so aids a user to view the display of the PDA when both hands are being used to position the test probes during measurement. In this example, the angle of the stand 58 is adjustable to allow the angle to be changed to suit optimum viewing. In other examples the stand may be fixed. When the stand is not required, it may be folded to a stowed position. The stand is retained in the housing using moulded bosses. A shoulder on the stand is trapped inside the boss by a screw or similar fixing to allow the stand to freely rotate without coming out of the boss. Other conventional fixing means may be used.

Figure 6:
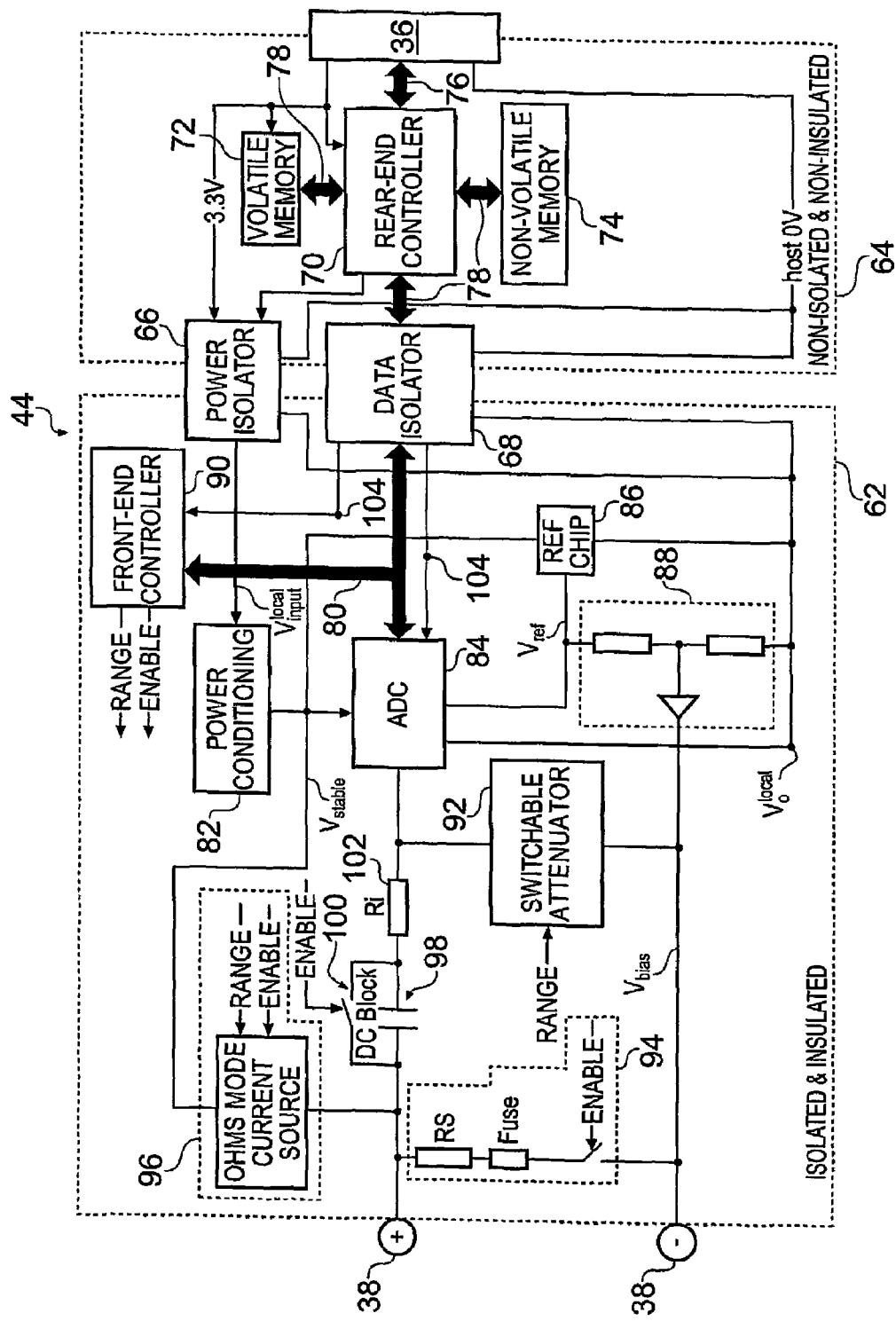
FIG. 6 is a schematic block diagram showing internal circuitry of the CF DMM shown in FIG. 3.

FIG. 6 is a schematic block diagram showing the internal circuitry 44 of the CF DMM. Only the circuitry associated with one measurement channel is shown for simplicity. The internal circuitry is divided into two sections, a front-end section 62 and a rear-end section 64. The front-end 62 and rear-end 64 are electrically isolated from each other but communicatively coupled via a power isolator 66 and a data isolator 68. The power isolator 66 is an electrically isolated coupler which allows operating power for the front-end to be coupled from the rear-end. The power isolator may be a DC-DC converter, a magneto-coupler, an opto-coupler or any other conventional isolated coupler. The data isolator 68 is a two-way electrically isolated coupler which allows data signals to be coupled between the rear-end and the front-end. The data isolator may be a DC-DC converter, a magneto-coupler, an inductive-coupler, an opto-coupler or any other conventional isolating coupler. The power isolator and data isolator affect a level of safety isolation between electrical signals applied to the input terminal of the CF DMM and the host device. This reduces the likelihood of causing damage to the host device or injury to a user when measuring high voltages. In cases where the CF DMM includes two, or more, measurement channels, a separate front-end is used for each channel although only a single rear-end is required. The single rear end being able to address each of the multiple front-ends independently. It can be possible, although not preferable, to reduce the number of required data isolators where there are multiple front-ends by connecting the respective front-end buses of the multiple front-ends together. This avoids the need to have separate data couplers for each of the multiple front-ends but is not preferable because it removes the electrical isolation between the multiple front-ends.

The rear-end comprises the CF format electrical connector 36 for coupling the CF DMM to a host device, a rear-end controller 70, a region of volatile memory 72, a region of non-volatile memory 74, an input side of the power isolator and an input/output side of the data isolator. The rear-end controller communicates with the host device via a CF conformant host bus 76, and with the data isolator and regions of memory via a rear-end bus 78. The rear-end bus architecture may be a proprietary architecture or conform to any standard bus architecture. The rear-end controller contains logic for interpreting accesses to the CF DMM from the host device and for returning data from the CF DMM to the host device via the host bus 76. The non-volatile memory contains information which should be maintained when power is removed from the CF DMM, for example when it is removed from a host, such as card information structure data and calibration factors. The volatile memory may be used while the card is under power, for example to store data measurements for later retrieval.

The rear-end operates on a 3.3 volt power supply taken directly from the host device through the CF interface. The 3.3 volt power supply is connected to the input side of the power isolator 66 such that power is coupled to an output side of the power isolator. The power at the output side may match the 3.3 volt power supply applied to the input side or may be converted to a different voltage, for example if a DC-DC converter is used to couple the power. The power to the front-end of the CF DMM can be switched on or off by the rear-end controller to conserve available power from the PDA. When the power coupling is switched off, the CF DMM is said to be in sleep mode. In this example CF DMM, where there are two measurement channels, each channel can be put into sleep mode independently. The on or off status of the power isolator is set by a control signal applied by the rear-end controller to a power isolator control line 24 connecting the rear-end controller to the power isolator. The power isolator control line is set high by the rear-end controller logic to enable power coupling via the power isolator and set low to disable power coupling and enter sleep mode. The rear-end controller logic may be configured to only disable power coupling under specific instruction from the host device. However, the rear-end controller may additionally contain internal logic which allows it to enter sleep mode under certain pre-set conditions. For example if the CF DMM does not receive new instructions from the host device for a fixed time and the input signal has not changed within a specified tolerance during this time, the power coupling may be disabled. This will allow power to be conserved should a user forget that the CF DMM is on.

The front-end section includes measurement circuitry for the CF DMM. The front-end is electrically isolated and insulated from the rear-end and from the exterior of the CF DMM, except for the input terminal. The front-end comprises the output side of the power isolator 66, an input/output side of the data isolator 78, a front-end bus 80 with the same architecture as the rear-end bus 78, power conditioning circuitry 82, an analogue-to-digital converter (ADC) 84, voltage reference circuitry 86, voltage divider circuitry 88, a front-end controller 90, a switchable attenuator 92, current measurement circuitry 94, resistance measurement circuitry 96, a blocking capacitor 98, a blocking-capacitor bypass switch 100, an input resistor 102 and the input terminals 38. Elements of the front-end circuitry are interconnected as indicated in FIG. 6. However, to simplify the figure, connections from the front-end controller labelled "RANGE" and "ENABLE" are not shown completely, but only on leaving or entering the respective circuit elements to which they are connected. The current measuring circuitry and the resistance measuring circuitry are each configured to output a voltage level to be measured by the ADC, the voltage level being dependent on the current or resistance applied to the input terminals respectively. Voltage measurement can be made directly by the ADC from an input signal applied to the input terminals, although the input resistor is arranged in series with the ADC's input line to protect the ADC input stage from over-current.

Which measurement function is to be used is determined by enable lines set by the front-end controller in response to configuration data received from the host device via the rear-end controller. The configuration data may be set according to user input to the host device, e.g. a user indicating that he wishes to make a particular type of measurement, or the configuration data may be set by the host device itself in response to particular operating conditions occurring. For example, if a user indicates that he wishes to change from making resistance measurements to current measurements, the host device may first configure the CF DMM to make a voltage measurement to ensure it is safe to allow current measurement to proceed. To enable current measurement, an enable switch (e.g. an electrical or mechanical relay) in the current measurement circuitry is closed, while a similar enable switch in the resistance measurement circuitry is opened. To enable voltage measurement, both the enable switch in the current measurement circuitry and the enable switch in the resistance measurement circuitry are opened. In other examples, measurement function selection may be performed by a mechanical switch on the CF DMM in a manner similar to that of a conventional DMM, however, software selection via configuration data will generally be preferred since this is less bulky.

The CF DMM card is able to directly measure current by measuring the voltage drop across an internal sense resistor $R_s$. A protection fuse in series with the sense resistor protects the CF DMM from damage caused by excessive current. The current measurement circuitry enable switch is also in series with the internal sense resistor $R_s$ as shown in FIG. 6. Many conventional DMMs do not support direct measurement of current, and of those that do, some require a special current terminal (e.g. a third 4 mm banana socket). This can make their use somewhat cumbersome since test probes have to be reconfigured between different measurement types. The CF DMM avoids this because of the software driven current measurement circuitry enable switch. As mentioned above, the software application running on the host device may include a protection scheme whereby the voltage between the input terminals is determined before allowing current mode to be selected. This can be done by making a normal DC coupled voltage reading. If the input terminals have a voltage differential which would blow the current measurement circuitry's protection fuse, a user can be interactively warned before the current measurement circuitry enable switch is closed. This helps to avoid having to replace the protection fuse and/or possibly damaging a circuit under test. With conventional DMMs it is all too easy to leave the test probes connected to an earlier test point and inappropriately select current measurement mode, thus shorting the circuit under test and possibly damaging the DMM. The resistance measurement circuitry 96 can measure resistance using a current source in a conventional manner where the CF DMM is configured to measure the voltage across an unknown resistance passing a known current, from which the unknown resistance can be calculated. Parts of the circuitry shown in FIG. 6 are similar to and will be understood from conventional DMM circuitry and only those parts which differ from conventional DMM circuitry are described in detail.

Unlike conventional DMMs, the measurement circuitry of the CF DMM employs a uni-polar power supply in its front-end. This is advantageous for creating a physically small and low-power consuming design since many off-the-shelf small-footprint analogue integrated circuits which are currently available and can be used in the CF DMM are optimised for uni-polar power applications. The uni-polar power supply derives from the output side of the power isolator 66. The lower voltage output line from the power isolator defines a voltage of $V_0^{local}$ and the higher voltage output line from the power isolator is at a voltage of $V_{input}^{local}$ with respect to $V_0^{local}$. The power conditioning circuitry 82 is conventional circuitry for stabilising $V_{input}^{local}$, for example by removing interference, and outputs a stable voltage $V_{stable}$. This is the main power source for the measurement circuitry elements. The voltage reference circuitry 86 is conventional circuitry for deriving a reference voltage $V_{ref}$ from the stable voltage $V_{stable}$. The reference voltage defines the top of the ADC's input range. That is to say the ADC is able to convert input analogue voltages in the range $V_0^{local}$ to $V_{ref}$ and to correspondingly output a digital signal between 0 and $2^{n-1}$, where n is the number of bits supported by the ADC. To allow proper measurement of input signals which swing both positive and negative, the negative input terminal of the CF DMM is biased to a potential $V_{bias}$. $V_{bias}$ is between $V_0^{local}$ and $V_{ref}$ and is derived from the voltage divider circuitry 88. Normally $V_{bias}$ would be set to half of $V_{ref}$, i.e. half of the internal reference voltage used by the ADC. By using a uni-polar power supply, no negative power rail generator is needed, thus saving space and power. Furthermore, no additional level shifting circuits are needed to feed an input signal to the ADC as the input signal is already biased around $V_{bias}$.

When taking a reading, the ADC 84 samples at a rate of 10,000 samples per second. However, higher or lower sampling rates may also be used, for example up to 100, 10,000 or 100,000 samples per second or more. Following an analogue voltage to digitised measurement data conversion by the ADC, the digitised measurement data are passed to the rear-end controller along measurement-data lines via the data isolator. The controller contains logic operable to receive the digitised measurement data from the ADC and to convert them into measurement data expressed in conventional units. This is done using calibration factors stored in the non-volatile memory 74 and by taking account of the function being performed, e.g. whether a voltage, current or resistance measurement is being made. Measurement data may be temporarily stored in the volatile memory 72 until they are collected by the application software running on the host device. The data may then be processed and/or displayed as determined by the application software running on the host device. For example, the host device may be configured to display the data as an oscilloscope-like trace.

Using a fast sampling ADC further allows the software application running on the host device to compute a "true root-mean-square (RMS)" value of AC input signals. In a conventional DMM, AC measurements are performed using either a transistor circuit or by a sigma-delta converter arrangement and in which the signal applied to the input terminals is coupled to the measurement circuitry via a blocking capacitor to remove any DC component. The RMS of the remaining signal is then approximated by AC current measurement circuitry. The output of such circuitry is a pseudo DC level but it still has ripple associated with the input signal. The pseudo DC level is determined and displayed. In the CF DMM there is no such circuit. Instead, the input waveform is sampled at a rate of, for example 10,000 samples per second, and the measurement data processed by the software application running on the host device to compute a true RMS value from the data measurement by fitting a function to the data. This has the advantage of simplifying the CF DMM front-end considerably, thus saving cost, space, and power.

In order to allow AC measurement of small signals in the presence of significant DC offsets, the DC blocking capacitor 98 can be used to de-couple DC signals applied to the input terminal from the ADC. When making DC measurements the blocking capacitor is bypassed by the blocking-capacitor bypass switch 102 which is enabled via an enable line from the front-end controller. The blocking-capacitor bypass switch is a miniature high voltage relay which is normally closed to save power (most measurements are likely to be DC coupled measurements and so this arrangement saves power by not needing to energise the relay coil during DC measurements). The setting of the blocking-capacitor bypass switch is dependent on configuration data transferred to the front-end controller.

To allow the CF DMM to measure signals outside of the range $V_0^{local}$ to $V_{ref}$, the input signal to the ADC can be attenuated by the switchable attenuator 92 depending on the magnitude of the input signal. Various different input ranges may selected by setting appropriate combinations of switches and resistors within the switchable attenuator. Each range is designed to have enough head-room (i.e. overlap between ranges) to allow an over-range or an under-range condition to be correctly detected and the CF DMM switchable attenuator appropriately reconfigured to measure a new range. This is achieved by sending new configuration data to the front-end controller. The front-end controller then configures the switchable attenuator via range control lines to shift to the next highest or lowest range as appropriate.

As described above, both configuration data and measurement data are transferred between the front-end and the rear-end through the data isolator. This is done via configuration-data lines and measurement-data lines within the front-end and rear-end buses 78, 80.

Data isolator elements are often bulky and this can make it difficult to employ a large number of independent isolated data channels within the data isolator. To reduce the required number of isolated data channels required, the CF DMM allows sharing measurement-data lines used by the ADC to output measurement data and configuration-data lines used by the front-end controller to receive configuration data. This is achieved by using a serial-interface ADC. A serial-interface ADC has the advantage of needing fewer measurement-data lines than a parallel interface ADC. The front-end controller includes a status storage register for storing configuration data for setting the range and enablement lines discussed above. The status storage register is also addressed using a serial-interface comprising the configuration-data lines. In general the interface protocol used by the ADC and the front-end controller will be different, although both will use a similar number of interface lines (typically between 3 and 5).

In this example P2 conforms to the industry standard "I2C" serial bus definition, but could equally be any other type of industry standard interface such as "Microwire", "SPI", or "3" or "4" wire "serial" types. In the example shown in FIG. 6, the configuration-data lines and the measurement-data lines of the two interfaces, respectively using P1 and P2, are made in parallel on the rear-end and front-end buses 78, 80, and through a common set of isolated data channels in the data isolator. The DMM with the DMM including means for indicating whether data transferred along the common channels are transferred according to the first or the second protocol. The DMM of FIG. 6 includes means for indicating whether data transferred along the common channels are transferred according to the first or the second protocol. These means comprise dedicated protocol-selection signal channels 104 for each of P1 and P2 in the data isolator, although, as outlined further below, other means may also be used. Depending on which protocol mode is being run, one of the protocol-selection signals is set by the rear-end controller to activate the appropriate one of the ADC or the front-end controller. By doing this, one or other of the ADC or front-end controller can be accessed while the other device is unaffected by the activity on the front-end bus. In an alternative embodiment, a similar isolated data channel sharing scheme is used for some or all of the configuration-data and measurement-data lines without using a dedicated protocol signal for each device. Instead, the rear-end controller affects selection and de-selection using features of the two protocols P1 and P2. For example, P2 may have a specific start sequence to address the front-end controller. If the start sequence is such that it is mutually exclusive to the normal operation of the P1 protocol, and if a similarly mutually exclusive addressing condition exists for P1 relative to P2, then the rear-end controller can decide to activate one or other of the ADC or the front-end controller, without interfering with the other. While an example relying on a start sequence has been given, other schemes could be used, for example clock phasing or clock stopping, or stop sequences, or connecting the two interfaces in such a way that the mutually exclusive activation of either device is done by selecting signal "pairings" which are exclusive to P1 or P2 during normal operation, for example an active-high "chip select" on one device that is active-low on the other.

Figure 7:
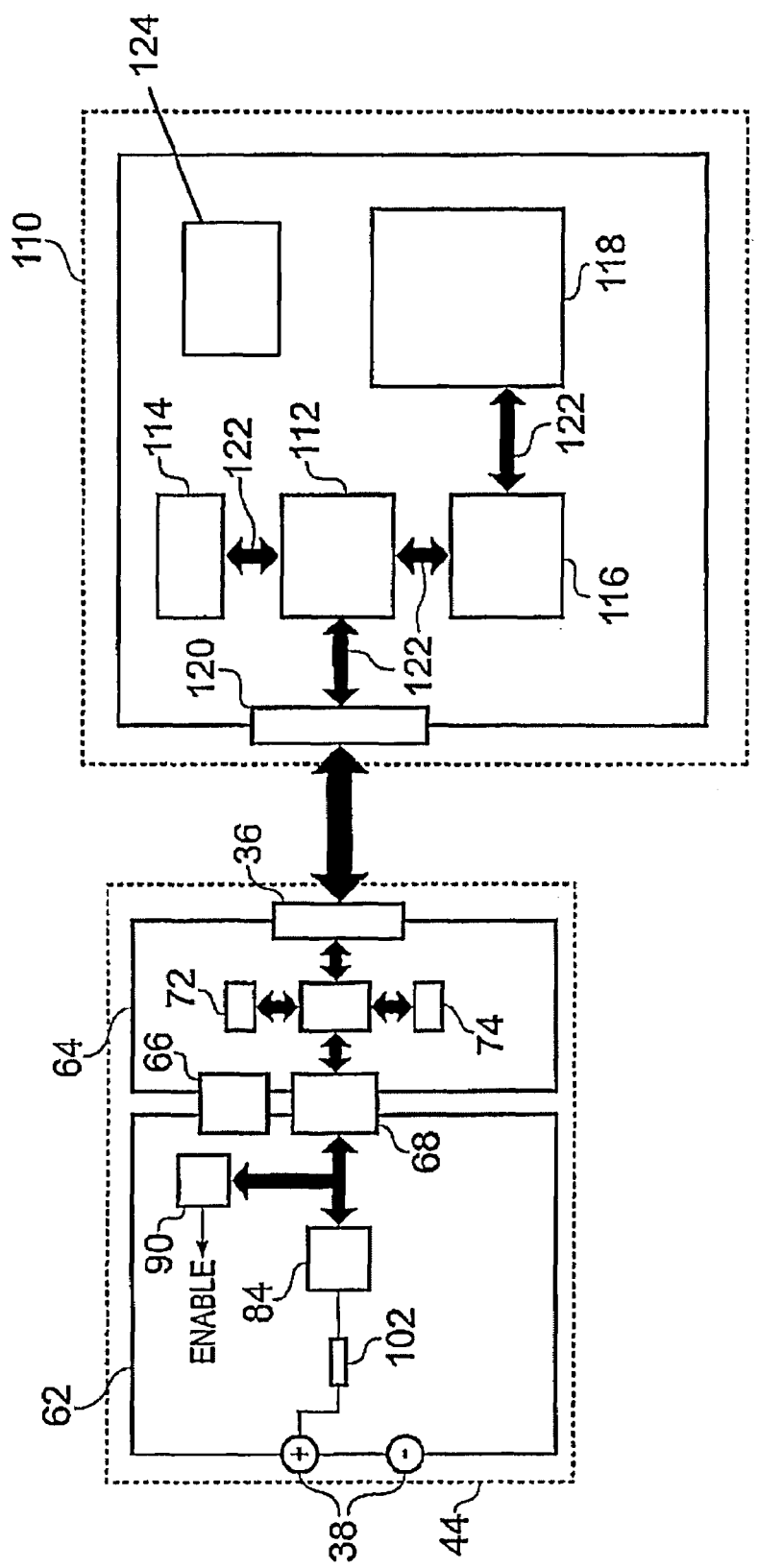
FIG. 7 is a schematic block diagram showing internal circuitry of the CF DMM and the PDA shown in FIG. 5.

FIG. 7 is a schematic block diagram showing how the internal circuitry 44 of the CF DMM interacts with internal circuitry 110 of a conventional PDA host device to which the CF DMM is attached during use. For simplicity, only some of the internal circuitry of the CF DMM shown in FIG. 6 is reproduced in FIG. 7. The PDA internal circuitry includes a central processing unit (CPU) 112, a PDA memory 114, a display screen driver 116 and a display screen 118. The PDA memory is divided into a program memory for storing a software application and a data memory for storing measurement data. The display screen is a touch-sensitive screen. These elements are interconnected by a PDA bus 122, as shown in FIG. 7. The PDA also includes a CF expansion socket 120 into which the CF DMM is plugged. The PDA memory stores a software application that can be loaded into the CPU so as to configure it to interact with the CF DMM and the display screen. The PDA further includes a wireless communications system 124.

When first initialised, the CPU configures the PDA display screen to present a welcome screen. A user is presented with a number of options which he may select by touching the screen at appropriate locations. The selected options define how the user wishes the DMM to function. Options may include, for example, which of the different measurement functions is desired and how data are to be represented. The flexibility of the CF DMM combined with a PDA allows an application programmer to design the application software to operate with any appropriate graphical user interface (GUI). Once the user has selected the appropriate options, for example by indicating that he wishes to measure DC voltages with a default screen display, the CPU configures the CF DMM. This is done by sending configuration data to the rear-end controller 78 of the CF DMM. The rear-end controller interprets the configuration data and passes it onto the front-end controller of the CF DMM. In this example, the configuration data will include instructions for the front-end controller to disable the current measurement circuitry and the resistance measurement circuitry by appropriately setting control lines for their respective enable switches, and to select a default range setting for the switchable attenuator. In this example, the default is to set the CF DMM to the most sensitive range, i.e. where there is no attenuation. The ADC samples the input signal and passes correspondingly digitised measurement data to the rear-end controller via the data isolator. If an input signal applied to the input terminals is outside of the selected range, the ADC saturates at its highest output. The rear-end controller checks for this condition and if it occurs sends new configuration data to the front-end controller telling it to reconfigure the switchable attenuator to change to the next most sensitive range. The process continues until the ADC no longer saturates. In other examples, the rear-end controller may pass measurement data directly to the PDA, the application software running on which is then responsible for determining whether the ADC is saturated, and if so, passing new configuration data to the CF DMM.

When the ADC is not saturated, the rear-end controller converts the digitised measurement data into measurement data expressed in conventional units, e.g. volts. This is be done by referring to calibration factors stored in the non-volatile memory and taking account of the measurement function being performed and the range setting employed. The conversion may rely on a simple linear mapping or may include a more complex algorithm, for example by taking possible non-linearities in the ADC response into account. The duly converted measurement data are passed to the software application running on the PDA host device for display, stored in the CF DMM non-volatile memory for later use, or both. Measurement data passed to the PDA can be displayed in any desired manner as determined by the application software running on the PDA.

To provide continually accurate readings, the CF DMM may be periodically calibrated. This can be achieved by connecting the input terminals to various external reference sources to allow appropriate calibration factors to be determined by observing the CF DMM response to known signals. The new calibration factors then replace the existing calibration factors in the CF DMM's non-volatile memory. The use of such calibration factors means that the CF DMM can be made "adjustment free" i.e. there are no manually variable elements that have to be adjusted to set the calibration (like the trimmer potentiometers common in classic DMMs, for example). Another advantage to this calibration approach is that the absolute accuracy of the components used in the front-end circuitry can be relaxed which can help reduce cost substantially. This is because otherwise out-of-tolerance components are accounted for by the calibration factors. The components used in the front-end should still have good temperature drift characteristics, however, so that the component values remain close to their values when the calibration factors were determined.

Figure 1:
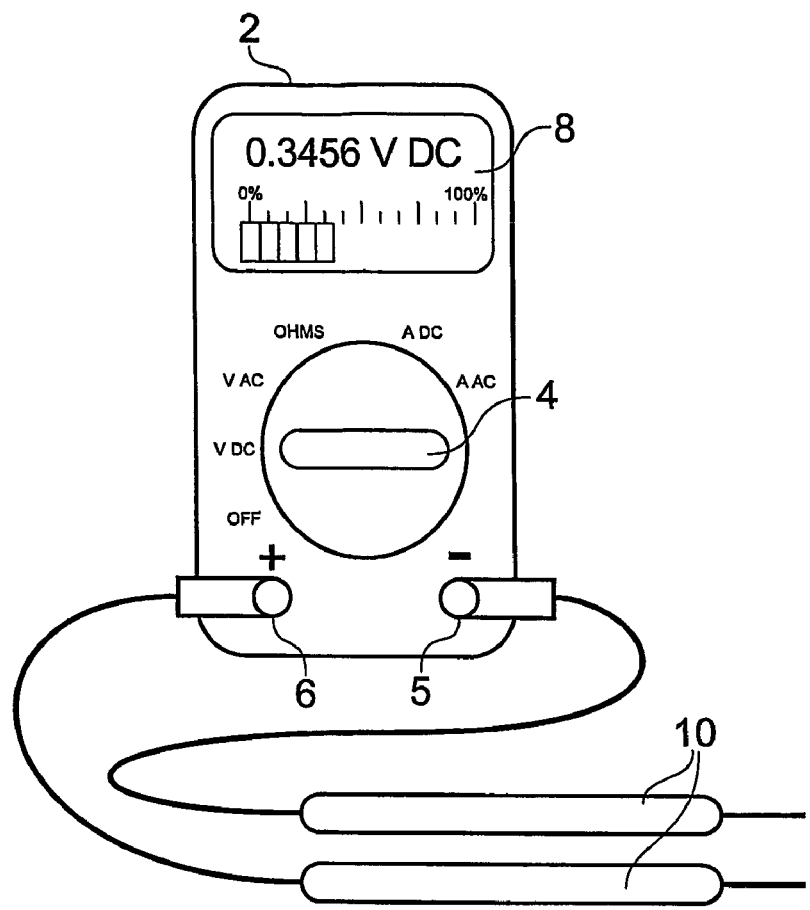
FIG. 1 is a schematic diagram of a conventional digital multi-meter (DMM)
Figure 2:
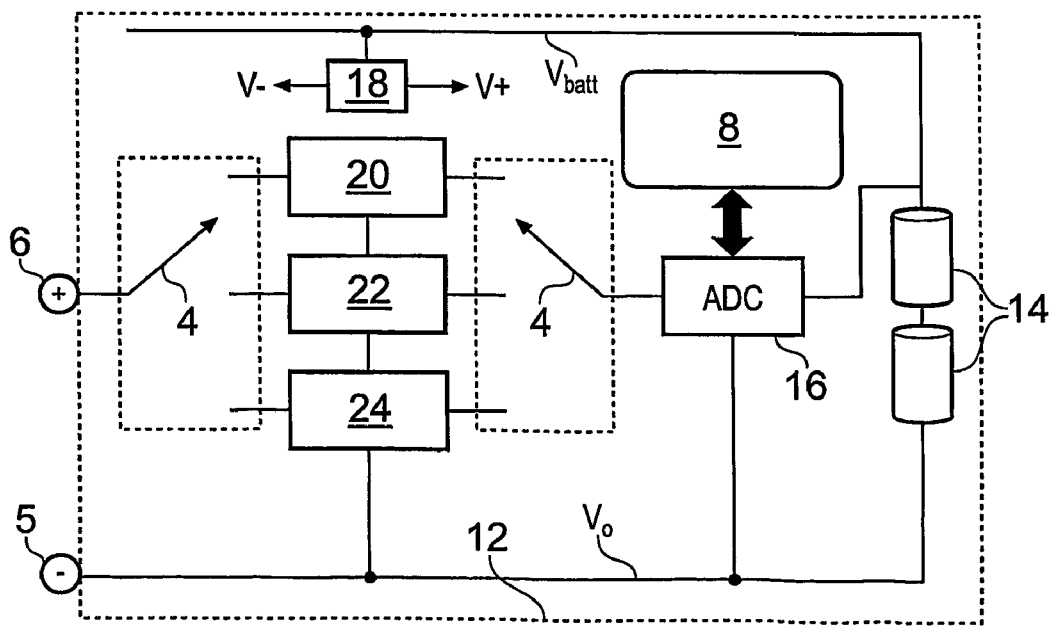
FIG. 2 is a schematic block diagram showing internal circuitry of the conventional DMM shown in FIG. 1.
Figure 8A:
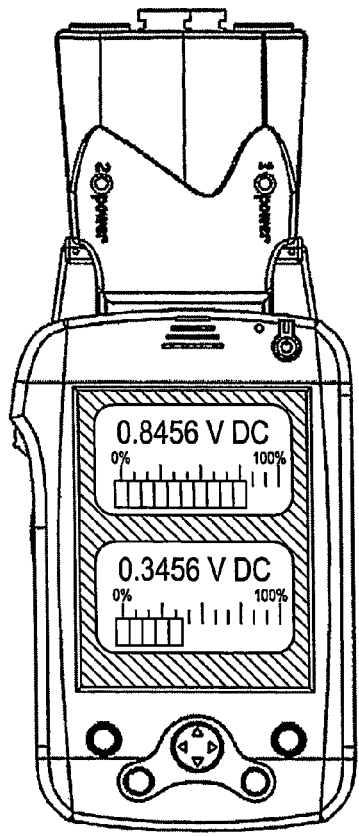
FIG. 8a is a schematic plan view showing an example screen display for the PDA of FIG. 5.
Figure 8B:
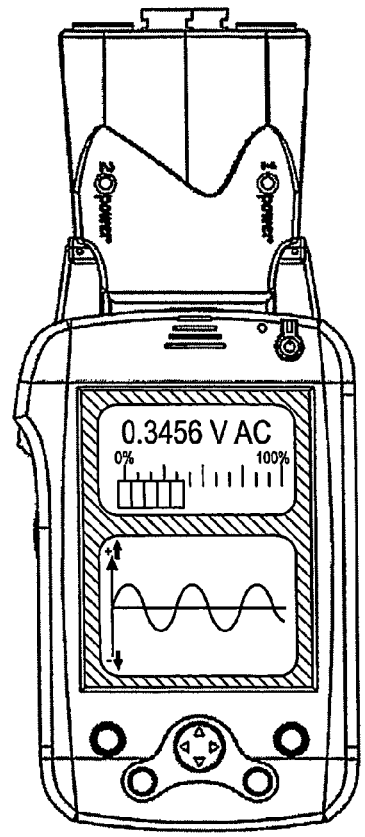
FIG. 8b is a schematic plan view showing another example screen display for the PDA of FIG. 5.

FIGS. 8a and 8b are schematic plan views showing example ways in which measurement data can be displayed. In FIG. 8a, the software application defines a GUI which is configured to resemble a conventional DMM display, such as that shown in FIG. 1. In this example measurement data from both the first and the second measurement channels are shown simultaneously, one being displayed above the other. In FIG. 8b, the software application defines a GUI which is configured to display only a single measurement channel in two formats. In an upper p art of the display measurement data are presented in a way which resembles a conventional DMM display. In the bottom half of the screen measurement data are presented in a way which resembles that of a digital storage oscilloscope. This is achieved by displaying the latest measurement data along with previously obtained measurement data which is retrieved either from the volatile memory of the CF DMM or the memory of the PDA, depending on where it is being stored. The time base may range from less than a second, for example to study high frequency signals, to several hours or even longer, for example to study long-term drifts. The range of possible display modes is limited only by the design of the application software and the limitations of the CF DMM and the PDA hardware.

In addition, to facilitate a "hands-free" use of the CF DMM, the application software running on the PDA may make use of commercially available text-to-speech software modules to allow annunciation of a displayed reading. This means that a data acquisition unit comprising the PDA and the CF DMM can be located at a remote place to that where the measurement probes are located. This is advantageous when measurements are required in difficult-to-reach places that do not allow an easy line-of-sight to the PDA's display. The annunciation can be made using a built in speaker device common to most PDAs.

The versatility of the CF DMM described above, being both flexible and portable, makes it suitable for a wide range of uses. Not only can a CF DMM function as a direct alternative to a conventional DMM, but by adopting the processing power and screen display of a PDA host device, the combined data acquisition unit becomes a powerful tool. This means a CF DMM can be made to perform tasks beyond those of conventional DMM, yet be equally portable. Furthermore, a CF DMM and host PDA can also be specifically tailored to suit particular applications. This can be done simply by appropriate programming of the PDA. For example, in a system where a DMM is required to measure the voltage from a temperature sensor, a conventional DMM would show only the voltage, a user would then need to convert this to a temperature. However, the programmability of the PDA in a data acquisition unit comprising a CF DMM and PDA would allow the PDA to perform this conversion and directly display a measured temperature to a user. Similarly, if the ratio of two voltages are of ultimate interest, a dual channel CF DMM coupled to an appropriately programmed PDA can be used to measure the two voltages and display the resulting ratio directly. The PDA can also be programmed to act as a diagnostic tool for use in a complex system whereby the PDA instructs a user what to do. This would allow a non-specialist user to collect data for later analysis by a system specialist. For example, a PDA could be programmed to instruct a user to connect test probes to particular locations. The PDA is then programmed to take required measurement data before then instructing the user to connect the probes elsewhere, at which point the PDA may reconfigure the CF DMM to take a different kind of measurement data. This has the advantage of being able to devolve routine data collection tasks to less skilled users who do not need to understand the system under test in any detail.

In one mode of use, the CF DMM can be used as a data logger. In this mode, the CF DMM is connected to a signal of interest, for example, a voltage output from a photo-detector, and is configured to continuously monitor the signal. The CF DMM passes measurement data to a connected PDA host device where they are stored in the PDA's memory for later review. The rate at which data are stored can be determined depending on the application at hand. For example, to measure a long term drift, a relatively low measurement data storage rate can be used, for example, one reading a minute. In cases such as this, the host device may be programmed to put the CF DMM into sleep mode between taking measurements to conserve power. In other cases, for example, where the host device is itself supplied with power from an external source, use of sleep mode may not be required. In other applications, a faster measurement data storage rate may be preferred, perhaps even as high as the rate at which the CF DMM can sample data. This may be used where the input signal is expected to vary on short time scales. The CF DMM may be configured to pass measurement data to the host device as and when they are taken, or may be configured to store measurement data in its own internal memory for latter retrieval. The length of time that the CF DMM will be able to take and store data in this way will depend on the measurement data storage rate and the available memory.

It is also possible to rely on other available functions of a host PDA device to which a CF DMM is connected to increase the capability of the resulting data acquisition unit further still. For example, many PDAs include wireless communication functionality. This can be, for example, via a generalised mobile or cellular phone network, or via a more specialised local wireless connection, for example a BLUETOOTH (RTM) or 802.11 standard connection. This can allow measurement data to be quickly and easily transferred to a remote processing or storage device or for configuration data to be received form a remote transmitter. For example, a data acquisition unit comprising a CF DMM connected to a PDA with BLUETOOTH (RTM) or 802.11 standard capability can be used to allow a user to monitor signals in an region that needs to be isolated. This would allow, for example, measurement data to be obtained from a system under test which operates in a vacuum chamber. Using a conventional DMM, it would be necessary to provide conduits through the vacuum chamber wall to get signals out. Other uses may include data logging and broadcast of measurement data taken in hostile environments, such as hazardous areas of a nuclear power station. A CF DMM of the kind described above can be easily and quickly deployed to allow it to take and send measurement data to, and receive instructions from, a remote computer connected to a wireless local area network (LAN) operating in the power station. If the power station does not support a wireless LAN, and the CF DMM and receiving device are too distant for other direct wireless communication schemes, a PDA host device with mobile phone capability can be configured to broadcast data via a cellular telephone network. Use of a cellular phone network to transmit measurement data will also be useful where a CF DMM and host device are located at a distant location, for example at a remote weather station. In another cases, a user may wish to broadcast data to a remote device simply for the convenience of avoiding trailing connections. For example, a user may be required to perform testing of a large system. In such a case, he may configure a PDA carrying a CF DMM to routinely send measurement data to a desktop computer in the same room. This will allow him to rely on the larger memory of the desktop computer to store data, or ensure that measurement data are immediately available to a network to which the desktop computer is attached.

It will be appreciated that the above described interactions between a CF DMM and a host device are only some of many possible ways in which a data acquisition system comprising a CF DMM and a PDA host device could be configured to operate. The inherent flexibility of the scheme allows many other manners of operation to be adopted. For example, instead of presenting a user with a welcome screen on initialisation, the PDA may automatically configure the CF DMM to function in the same mode as it was in before switch off, this can be achieved, for example, by ensuring the most recent configuration data is stored in the PDA memory. Similarly, while in the above examples certain tasks are performed within the CF DMM (e.g. application of calibration factors) while certain other tasks are performed in the PDA (e.g. long term memory storage), there is a wide scope for performing tasks in either the CF DMM or the PDA depending on the application at hand and the hardware capabilities of the CF DMM and PDA. For example, if the CF DMM rear-end controller is relatively slow compared to the rate at which the ADC samples, the PDA may calibrate the digitised measurement data itself using calibration factors downloaded from the CF DMM on initialisation, thus avoiding the need for the rear-end controller to perform calibrations. Conversely, if the CF DMM is the more powerful computing device and contains sufficient memory it may be preferable to use the CF DMM itself for long-term data storage rather than the PDA.

It will also be appreciated that the PDA industry has adopted a number of standard interfaces of which the CF interface is only one. It will therefore be understood that while the use of a CF interface is described above, other examples of PDA conformant peripheral device card interface are equally applicable. Examples of other PDA conformant peripheral device card interfaces are the "newcard" format and the Secure Digital Input/Output (SDIO) format card interfaces. It should be understood that the use of "CF interface" and similar terms throughout the above description are intended to encompass all other PDA conformant peripheral device card interfaces, unless the context demands otherwise.

The invention claimed is:

1. A data acquisition unit comprising a digital multi-meter (DMM) including a personal digital assistant (PDA) peripheral device card conformant interface, the DMM being operable to output measurement data to the PDA conformant interface in response to input signals applied to input terminals and the operation of the DMM being configurable by configuration data received from the PDA conformant interface and a computing device including a personal digital assistant (PDA) peripheral device card conformant interface, the computing device having a program memory storing a software application for configuring the computing device to supply digital multi-meter (DMM) configuration data to the PDA conformant interface and to receive DMM measurement data through the PDA conformant interface, the DMM and the computing device being connectable through their respective PDA conformant interfaces, measurement circuitry of the DMM being configured to operate from a uni-polar power supply and includes a voltage divider connected between lower and upper voltages of the uni-polar power supply to provide a reference voltage, and the reference voltage being connected to a one of the input terminals.

2. A data acquisition unit according to claim 1, wherein the DMM includes a mating part and an extension housing attached thereto to form a single structure, the mating part conforming to a form factor of the PDA conformant interface.

3. A data acquisition unit according to claim 2, wherein the mating part and the extension housing combine to form a rigid structure.

4. A data acquisition unit according to claim 2, wherein the DMM further includes a load-bearing component which extends through and is attached to both the mating portion and the extension housing.

5. A data acquisition unit according to claim 4, wherein the load-bearing component is a printed circuit board (PCB) containing circuitry of the DMM.

6. A data acquisition unit according to claim 2, wherein the input terminals comprise connection sockets mounted on an end face of the extension housing distal to the mating part.

7. A data acquisition unit according to claim 1, wherein the DMM further includes an electrically isolated data coupler arranged to couple data lines between a front-end and a rear-end of the DMM.

8. A data acquisition unit according to claim 7, wherein measurement data outputted to the PDA conformant interface are first passed along measurement-data lines coupled through the electrically isolated data coupler.

9. A data acquisition unit according to claim 7, wherein configuration data received from the PDA conformant interface are subsequently passed along configuration-data lines coupled through the electrically isolated data coupler.

10. A data acquisition unit according to claim 8, wherein configuration data received from the PDA conformant interface are subsequently passed along configuration-data lines coupled through the electrically isolated data coupler and wherein at least one of the configuration-data lines and at least one of the measurement-data lines are connected together and coupled through a common channel of the electrically isolated data coupler.

11. A data acquisition unit according to claim 10, wherein configuration data are transferred according to a first protocol and measurement data are transferred according to a second protocol, the DMM further including means for indicating whether data transferred along the common channel are transferred according to the first or the second protocol.

12. A data acquisition unit according to claim 1, wherein the DMM further includes an electrically isolated power coupler arranged to couple operating power between a front-end and a rear-end of the DMM.

13. A data acquisition unit according to claim 1, wherein the DMM is operable to receive operating power through the PDA conformant interface.

14. A data acquisition unit according to claim 1, wherein the DMM further includes a stowable stand which can be arranged to support the DMM when in use.

15. A data acquisition unit according to claim 1, wherein the DMM includes multiple independent measurement channels.

16. A data acquisition unit according to claim 1, wherein the PDA conformant interface is a compact flash (CF) card interface.

17. A data acquisition unit according to claim 1, wherein the PDA conformant interface is a newcard card interface.

18. A data acquisition unit according to claim 1, wherein the PDA conformant interface is a Secure Digital Input Output (SDIO) card interface.

19. A data acquisition unit according to claim 1, wherein the computing device includes a display screen and the software application is operable to configure the computing device to display measurement data received through the PDA conformant interface on the display screen.

20. A data acquisition unit according to claim 1, wherein the computing device includes a data memory and the software application is operable to configure the computing device to store measurement data received through the PDA conformant interface in the data memory.

21. A data acquisition unit according to claim 1, wherein the software application is operable to configure the computing device to supply configuration data to the PDA conformant interface in response to measurement data received through the PDA conformant interface.

22. A data acquisition unit according to claim 1, wherein the computing device includes a wireless communication system.

23. A data acquisition unit according to claim 22, wherein the software application is operable to configure the computing device to communicate measurement data received through the PDA conformant interface to a remote receiver using the wireless communication system.

24. A data acquisition unit according to claim 22, wherein the software application is operable to configure the computing device to receive DMM configuration data from a remote transmitter using the wireless communication system and to supply the configuration data to the PDA conformant interface.

25. A data acquisition unit according to claim 1, wherein the computing device includes a speech synthesis system, and the software application is operable to configure the computing device to announce measurement data received through the PDA conformant interface.

26. A data acquisition unit according to claim 1, wherein the computing device is a PDA.

27. A computer program product comprising machine readable instructions stored on a computer-readable media and executable to configure a computing device of a data acquisition unit according to claim 1.

28. The computer program product according to claims 27 comprising a computer program on a carrier medium.

29. The computer program product of claim 28, wherein the carrier medium is a storage medium.

30. The computer program product of claim 28, wherein the carrier medium is a transmissions medium.

31. A data acquisition unit comprising a digital multi-meter (DMM) including a personal digital assistant (PDA) peripheral device card conformant interface, the DMM being operable to output measurement data to the PDA conformant interface in response to input signals applied to input terminals and the operation of the DMM being configurable by configuration data received from the PDA conformant interface and a computing device including a personal digital assistant (PDA) peripheral device card conformant interface, the computing device having a program memory storing a software application for configuring the computing device to supply digital multi-meter (DMM) configuration data to the PDA conformant interface and to receive DMM measurement data through the PDA conformant interface, the DMM and the computing device being connectable through their respective PDA conformant interfaces, the DMM further including an electrically isolated data coupler arranged to couple data lines between a front-end and a rear-end of the DMM, measurement data outputted to the PDA conformant interface being first passed along measurement-data lines coupled through the electrically isolated data coupler, configuration data received from the PDA conformant interface being subsequently passed along configuration-data lines coupled through the electrically isolated data coupler, and wherein at least one of the configuration-data lines and at least one of the measurement-data lines are connected together and coupled through a common channel of the electrically isolated data coupler.

32. A data acquisition unit according to claim 31, wherein configuration data are transferred according to a first protocol and measurement data are transferred according to a second protocol, the DMM further including means for indicating whether data transferred along the common channel are transferred according to the first or the second protocol.

33. A data acquisition unit comprising a digital multi-meter (DMM) including a personal digital assistant (PDA) peripheral device card conformant interface, the DMM being operable to output measurement data to the PDA conformant interface in response to input signals applied to input terminals and the operation of the DMM being configurable by configuration data received from the PDA conformant interface and a computing device including a personal digital assistant (PDA) peripheral device card conformant interface, the computing device having a program memory storing a software application for configuring the computing device to supply digital multi-meter (DMM) configuration data to the PDA conformant interface and to receive DMM measurement data through the PDA conformant interface, the DMM and the computing device being connectable through their respective PDA conformant interfaces, and the DMM further including an electrically isolated power coupler arranged to couple operating power between a front-end and a rear-end of the DMM.

34. A data acquisition unit according to claim 33, wherein the DMM is operable to receive operating power through the PDA conformant interface.

* * * * *